(12) United States Patent
Kano et al.

(10) Patent No.: US 9,543,336 B2
(45) Date of Patent: Jan. 10, 2017

(54) THIN FILM TRANSISTOR ARRAY PANEL

(71) Applicant: Samsung Display Co., Ltd., Yongin-si (KR)

(72) Inventors: Masataka Kano, Hwaseong-si (KR); Ji Hun Lim, Goyang-si (KR); Yeon Keon Moon, Seoul (KR); Jun Hyung Lim, Seoul (KR); So Young Koo, Yongin-si (KR); Myoung Hwa Kim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/963,769

(22) Filed: Dec. 9, 2015

(65) Prior Publication Data

US 2016/0365368 A1    Dec. 15, 2016

(30) Foreign Application Priority Data

Jun. 11, 2015  (KR) .................. 10-2015-0082716

(51) Int. Cl.
*H01L 27/14* (2006.01)
*H01L 29/04* (2006.01)
(Continued)

(52) U.S. Cl.
CPC ......... *H01L 27/1248* (2013.01); *H01L 27/124* (2013.01); *H01L 27/1259* (2013.01);
(Continued)

(58) Field of Classification Search
USPC ....... 257/223, 72, 57, 59, 83, 257, 290, 351, 257/368, 392, 66, 227, 291, 292, 439, 257/443, 655, 40, 99, 642–643, 759, 257/E51.001–E51.052, E25.008–E25.009, 257/E27.1, E27.125, E29.147, E29.151, 257/E29.182, E29.202, 257/E29.273–E29.299, E29.314, 257/E29.32, E23.016, E21.094, E21.104, 257/E21.121, E21.372, E21.411–E21.416; 438/149, 29, 69, 82, 99, 28, 30, 48, 128, 438/151, 157, 161, 283
See application file for complete search history.

(56) References Cited

U.S. PATENT DOCUMENTS 7,816,671 B2   10/2010   Park et al.
8,895,960 B2   11/2014   Murata et al.
(Continued)

FOREIGN PATENT DOCUMENTS

JP   2008078653   4/2008
JP   2010080554   4/2010
(Continued)

OTHER PUBLICATIONS

S. Kobayashi, et al., "Control of carrier density by self-assembled monolayers in organic field-effect transistors", Nature Materials, vol. 3, May 2004, pp. 317-322.

*Primary Examiner* — Tram H Nguyen
(74) *Attorney, Agent, or Firm* — H.C. Park & Associates, PLC

(57) ABSTRACT

A thin-film transistor array panel includes a substrate, a first gate electrode disposed on the substrate, a first self-assembled monolayer disposed on the first gate electrode, a gate insulating layer disposed on the first self-assembled monolayer, a semiconductor disposed on the gate insulating layer, a drain electrode overlapping the semiconductor, the drain electrode being separated from and facing a source electrode with respect to the semiconductor, a first interlayer insulating layer disposed on the source electrode and the drain electrode, a second self-assembled monolayer disposed on the first interlayer insulating layer, a second gate electrode disposed on the second self-assembled monolayer, a second interlayer insulating layer disposed on the second gate electrode, and a pixel electrode disposed on the second interlayer insulating layer and connected to the drain electrode.

16 Claims, 10 Drawing Sheets

(51) Int. Cl.
    *H01L 29/15*           (2006.01)
    *H01L 31/036*         (2006.01)
    *H01L 27/12*           (2006.01)
    *H01L 29/417*         (2006.01)
    *H01L 29/423*         (2006.01)
    *H01L 29/786*         (2006.01)
    *H01L 29/66*           (2006.01)
    *H01L 29/788*         (2006.01)

(52) U.S. Cl.
    CPC .. *H01L 29/41733* (2013.01); *H01L 29/42384* (2013.01); *H01L 29/66742* (2013.01); *H01L 29/788* (2013.01); *H01L 29/78606* (2013.01)

(56) References Cited

U.S. PATENT DOCUMENTS

| | | | |
|---|---|---|---|
| 2008/0002087 A1* | 1/2008 | Kim | G02F 1/136286 |
| | | | 349/46 |
| 2010/0065818 A1* | 3/2010 | Kim | B82Y 10/00 |
| | | | 257/14 |
| 2014/0160419 A1* | 6/2014 | Lee | G02F 1/1341 |
| | | | 349/154 |
| 2015/0123126 A1 | 5/2015 | Yamazaki et al. | |
| 2016/0190330 A1* | 6/2016 | Yamazaki | H01L 29/7869 |
| | | | 257/43 |

FOREIGN PATENT DOCUMENTS

| | | |
|---|---|---|
| JP | 5151122 | 12/2012 |
| JP | 2013236072 | 11/2013 |
| KR | 101275710 | 6/2013 |

\* cited by examiner

THIN FILM TRANSISTOR ARRAY PANEL

CROSS-REFERENCE TO RELATED APPLICATION

This application claims priority from and the benefit of Korean Patent Application No. 10-2015-0082716, filed on Jun. 11, 2015, which is hereby incorporated by reference for all purposes as if fully set forth herein.

BACKGROUND

Field

Exemplary embodiments relate to a thin-film transistor array panel, and more particularly, to a thin-film transistor array panel including self-assembled monolayers.

Discussion of the Background

A thin-film transistor (TFT) may be used in various electronic devices such as a flat panel display or the like. A TFT may be used as a switching element or a driving element in a flat panel display, such as a liquid crystal display (LCD), an organic light emitting diode (OLED) display, an electrophoretic display, or the like.

A TFT may include a gate electrode connected to a gate line that transmits a scanning signal, a source electrode connected to a data line that transmits a signal to be applied to a pixel electrode, a drain electrode that faces the source electrode, and a semiconductor electrically connected to the source electrode and the drain electrode.

A semiconductor may be formed of amorphous silicon, polysilicon, or an oxide semiconductor. A TFT may maintain a predetermined threshold voltage, however the threshold voltage may be non-uniform or may be shifted depending on the type of the semiconductor. As such, when the threshold voltage is non-uniform or shifted, a separate compensation circuit may be added.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments of the present invention provides a thin-film transistor array panel that may control a threshold voltage without a separate compensation circuit.

Additional aspects will be set forth in the detailed description which follows, and, in part, will be apparent from the disclosure, or may be learned by practice of the inventive concept.

An exemplary embodiment discloses a thin-film transistor array panel including a substrate, a first gate electrode disposed on the substrate, a first self-assembled monolayer disposed on the first gate electrode, a gate insulating layer disposed on the first self-assembled monolayer, a semiconductor disposed on the gate insulating layer, a drain electrode overlapping the semiconductor, the drain electrode being separated from and facing a source electrode with respect to the semiconductor, a first interlayer insulating layer disposed on the source electrode and the drain electrode, a second self-assembled monolayer disposed on the first interlayer insulating layer, a second gate electrode disposed on the second self-assembled monolayer, a second interlayer insulating layer disposed on the second gate electrode, and a pixel electrode disposed on the second interlayer insulating layer and connected to the drain electrode.

An exemplary embodiment also discloses a method of forming a thin-film transistor array panel including forming a first gate electrode on a substrate, forming a first self-assembled monolayer on the first gate electrode, forming a gate insulating layer on the first self-assembled monolayer, forming a semiconductor on the gate insulating layer, forming a drain electrode overlapping the semiconductor, the drain electrode being separated from and facing a source electrode with respect to the semiconductor, forming a first interlayer insulating layer on the source electrode and the drain electrode, forming a second self-assembled monolayer on the first interlayer insulating layer, forming a second gate electrode on the second self-assembled monolayer, forming a second interlayer insulating layer on the second gate electrode, and forming a pixel electrode on the second interlayer insulating layer and connected to the drain electrode.

According to exemplary embodiments, a thin-film transistor array panel may be configured to control a threshold voltage without a separate compensation circuit.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
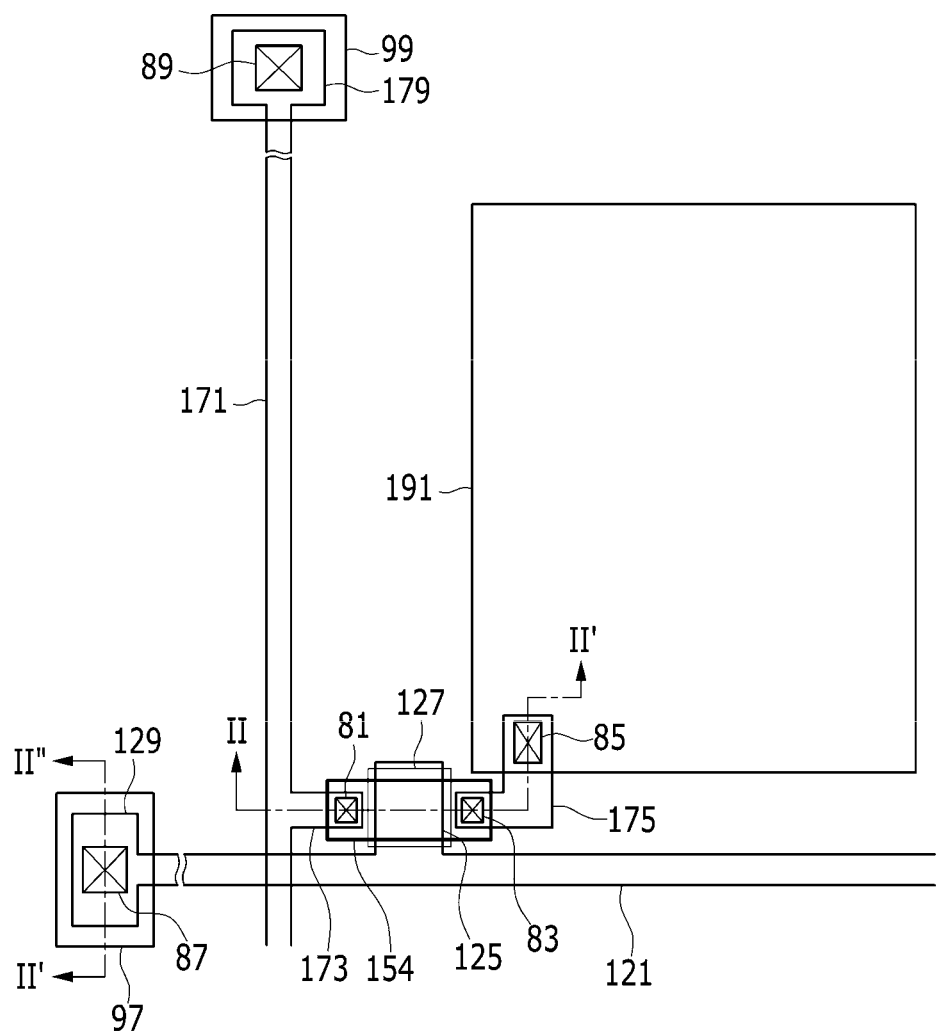
FIG. 1 is a layout view of a thin film-transistor array panel according to exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
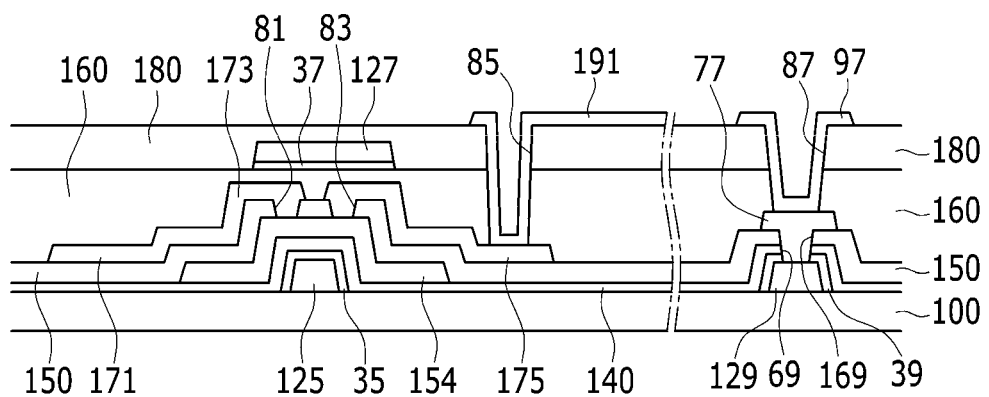
FIG. 2 is a cross-sectional view taken along lines II-IF and II'-II" of FIG. 1.

FIG. 1 is a layout view of a thin-film transistor array panel according to exemplary embodiments. FIG. 2 is a cross-sectional view taken along line II-IF and II'-II" of FIG. 1.

Referring to FIG. 1, a gate line 121 is formed on an insulation substrate 100. The substrate 100 may include polycarbonate, polyimide, polyether sulfone, glass, or the like. The substrate 100 may be a transparent substrate having flexibility, such as elasticity or the like, which may be folded, bent, rolled, or stretched in at least one direction.

The gate line 121 may transmit a scan signal and mainly extend in a horizontal direction. Each gate line 121 may include a first gate protruding from the gate line 121 and an end portion 129 (hereinafter referred to as a gate pad) having a wide area for connection with another layer or an external driving circuit.

The gate line 121 may include aluminum (Al) or an aluminum alloy, silver (Ag) or a silver alloy, copper (Cu) or a copper alloy, molybdenum (Mo) or a molybdenum alloy, chromium (Cr), tantalum (Ta), or titanium (Ti). Alternatively, the gate line 121 may have a multilayer structure including two conductive layers (not shown), of which physical properties are different from each other.

A first self-assembled monolayer 35 may be formed on the gate line 121 and the first gate electrode 125. The first self-assembled monolayer 35 may be formed along a surface of the gate line 121 and the first gate electrode 125, and may have a thickness of about 0.5 nm to 10 nm.

The first self-assembled monolayer 35 may be formed differently depending on a type of a semiconductor, which will be further described below. More particularly, in an N-type semiconductor, the first self-assembled monolayer 35 may include an electron acceptor material, and in a P-type semiconductor, the first self-assembled monolayer 35 may include an electron donor material. The first self-assembled monolayer 35 may include a thiol group, which may have good affinity with the underlying first gate electrode 125. For example, in the N-type semiconductor, the first self-assembled monolayer 35 may include a fluoroaryl thiol derivative, and in the P-type semiconductor, the first self-assembled monolayer 35 may include an aminoaryl thiol derivative.

A gate insulating layer 140 is formed on the first self-assembled monolayer 35. The gate insulating layer 140 may include an insulating material, such as silicon oxide (SiOx), silicon nitride (SiNx), or silicon oxynitride (SiON). The gate insulating layer 140 may be formed by using a chemical vapor deposition method.

A semiconductor 154 is formed on the gate insulating layer 140. According to an exemplary embodiment, the semiconductor 154 may be amorphous silicon, polysilicon, or oxide semiconductor. The oxide semiconductor may be a metal oxide semiconductor, which may include a metal oxide of zinc (Zn), indium (In), gallium (Ga), hafnium (Hf), tin (Sn), copper (Cu), and titanium (Ti), or a combination of a metal, such as Zn, In, Ga, Hf, Sn, Cu, and Ti, and an oxide thereof.

According to exemplary embodiments, the semiconductor 154 may be polysilicon doped with N-type conductivity impurities, such as phosphorous (P), arsenic (As), or antimony (Sb), or P-type conductivity impurities, such as boron (B). The semiconductor 154 may be an N-type oxide semiconductor or a P-type oxide semiconductor. For example, the N-type oxide semiconductor may include at least one of zinc oxide (ZnO), gallium-zinc oxide (GaZnO), indium-zinc oxide (IZO), indium oxide ($In_2O_3$), indium-gallium-zinc oxide (IGZO), zinc-tin oxide (ZTO), indium-zinc-tin oxide (IZTO), and indium-gallium-tin oxide (InGaSnO). The P-type oxide semiconductor may include tin oxide (SnO) or copper oxide (CuO) including a copper metal.

An etching stop layer 150 is formed on the semiconductor 154. The etching stop layer 150 may have contact holes 81, 83, and 69 exposing the semiconductor 154. According to an exemplary embodiment, the etching stop layer 150 may be formed only on a channel of the semiconductor 154, such that the contact holes 81, 83, and 69 may not be formed therein.

The etching stop layer 150 may include SiOx or SiNx, and may cover a channel of the semiconductor 154 to prevent the semiconductor 154 from being exposed and damaged by an etching solution in a subsequent etching processes. The etching stop layer 150 may include a material having high etch selectivity with respect to the semiconductor 154, such as SiOx or SiNx, and may have a single layer or multilayer structure.

An assistance gate pad 77, a drain electrode 175, and a data line 171 are formed on the etching stop layer 150. The data line 171 may include a source electrode 173 extending toward the semiconductor 154 and may transmit a data signal. The data line 171 mainly extends in a vertical direction, thus substantially crossing the gate line 121. Each data line 171 includes a wide end portion (hereinafter referred to as a data pad) 179 for connection with another layer or an external driving circuit. The data line 171 may be formed as a single layer or a multilayer of a low-resistive metal, such as Cu, Ti, Mo, Al, and the like.

When the data line 171 and the drain electrode 175 include a material that may be diffused, such as Cu or Al, the data line 171 may further include a diffusion barrier layer (not shown) between the semiconductor 154 and the data line 171, thereby forming a multilayer structure. The diffusion barrier layer (not shown) may include IZO, GaZnO, Ti, Mo, or an alloy thereof. The source electrode 173 and the drain electrode 175 are respectively connected to the semiconductor 154 through the contacts holes 81 and 83, and the assistance gate pad 77 is connected to the gate pad 129 through the contact hole 69.

One gate electrode 125, one source electrode 173, and one drain electrode 175 may form one thin-film transistor (TFT) along the semiconductor 154, and a channel of the TFT is formed in the semiconductor 154 between the source electrode 173 and the drain electrode 175. A first interlayer insulating layer 160 is formed on the assistance gate pad 77, the data line 171, and the drain electrode 175. The first interlayer insulating layer 160 may include SiNx or SiOx, and may have a single layer or multilayer structure.

A second self-assembled monolayer 37 and a second gate electrode 127 are formed on the first interlayer insulating layer 160. The second gate electrode 127 having an island shape may be floated. The second self-assembled monolayer 37 may be formed of an electron acceptor material or an electron donor material, and may include a silane group, which may have a reactivity with the first interlayer insulating layer 160.

For example, when the semiconductor 154 is the N-type semiconductor, the second self-assembled monolayer 37 may include a fluoroalkyl silane derivative or a fluoroaryl silane derivative. When the semiconductor 154 is the P-type semiconductor, the second self-assembled monolayer 37 may include an aminoalkyl silane derivative or an aminoaryl silane derivative. The second gate electrode 127 may include the same material as the first gate electrode 125.

A second interlayer insulating layer 180 is formed on the second gate electrode 127. The second interlayer insulating layer 180 may include contact holes 85 and 87 exposing the drain electrode 175 and the assistance gate pad 77.

The second interlayer insulating layer 180 may be formed of the inorganic material such as SiOx or SiNx, or an organic material having a low dielectric ratio. The organic material may be formed by a spin coating method and may flatten the substrate 100.

A pixel electrode 191 and contact assistants 97 and 99 are formed on the second interlayer insulating layer 180. The pixel electrode 191 and contact assistants 97 and 99 may include a transparent conductive material, such as indium tin oxide (ITO) or indium zinc oxide (IZO), or a reflective metal such as Al, Ag, Cr, or an alloy thereof.

The pixel electrode 191 is electrically connected to the drain electrode 175 through the contact hole 85, thereby receiving the data voltage from the drain electrode 175. The contact assistants 97 and 99 are connected to the gate pad 129 and the data pad 179 through the contact holes 87 and 89, respectively.

Generally, when an oxide semiconductor transistor includes a P-type transistor, a threshold voltage thereof may be shifted in a negative direction, and when an oxide semiconductor transistor includes an N-type transistor, a threshold voltage thereof may be shifted in the positive direction, thus deteriorating electric characteristics of the transistor.

According to the present exemplary embodiment, the first and second self-assembled monolayers 35 and 37 may be respectively formed in the first gate electrode 125 and the second gate electrode 127, thus a threshold voltage Vth of the transistor may be easily controlled by the self-assembled monolayers 35 and 37.

When the first and second self-assembled monolayers 35 and 37 according to the present exemplary embodiment are formed, a dipole may be formed in an interface between the first gate electrode 125 and the gate insulating layer 140, and between the second gate electrode 127 and the first interlayer insulating layer 160, such that the threshold voltage Vth may be independently controlled for each transistor. More particularly, by forming the self-assembled monolayers 35 and 37, the threshold voltage Vth of the N-type transistor may be shifted in the negative direction, and the threshold voltage of the P-type transistor may be shifted in the positive direction.

Hereinafter, a manufacturing method of a thin-film transistor array panel according to an exemplary embodiment of the present invention will be described with reference to accompanying drawings.

Figure 3:
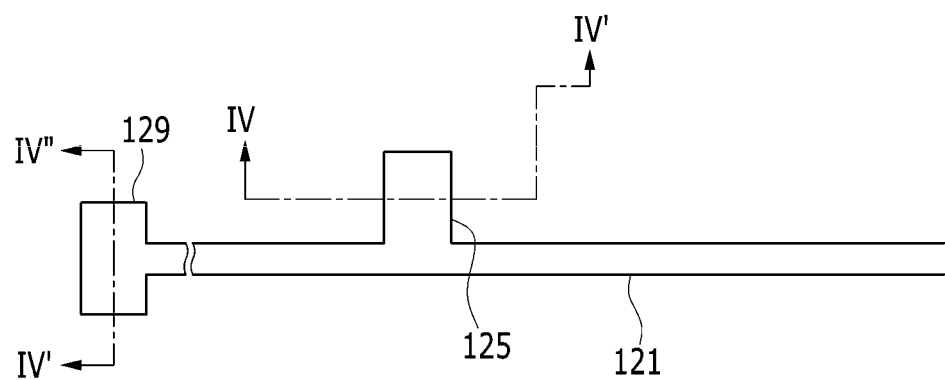
FIG. 3 is a layout view of a thin-film transistor array panel according to exemplary embodiments.
Figure 4:
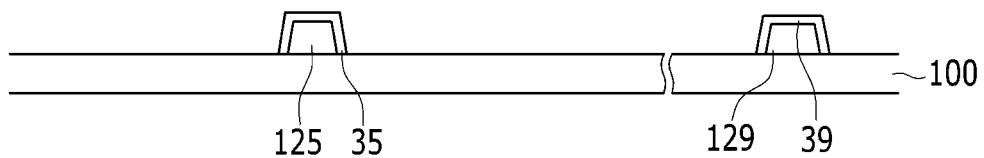
FIG. 4 is a cross-sectional view taken along lines IV-IV' and IV'-IV" of FIG. 3.
Figure 5:
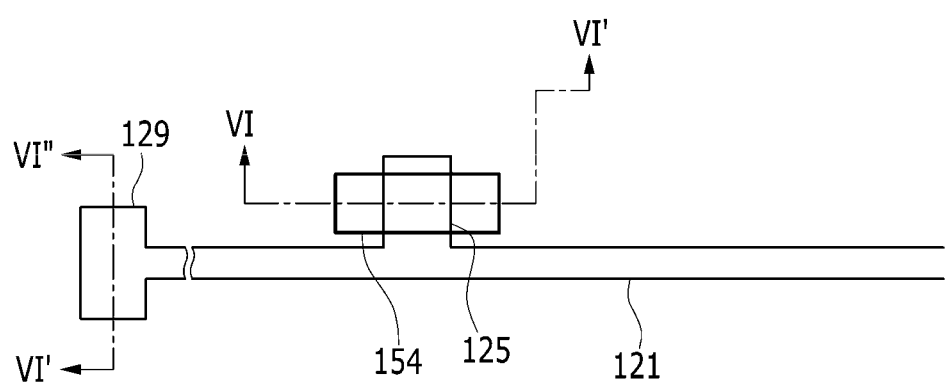
FIG. 5 is a layout view of a next step of FIG. 3.
Figure 6:
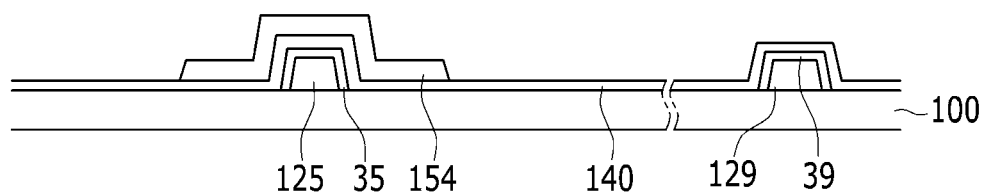
FIG. 6 is a cross-sectional view taken along lines VI-VI' and VI'-VI" of FIG. 5.
Figure 7:
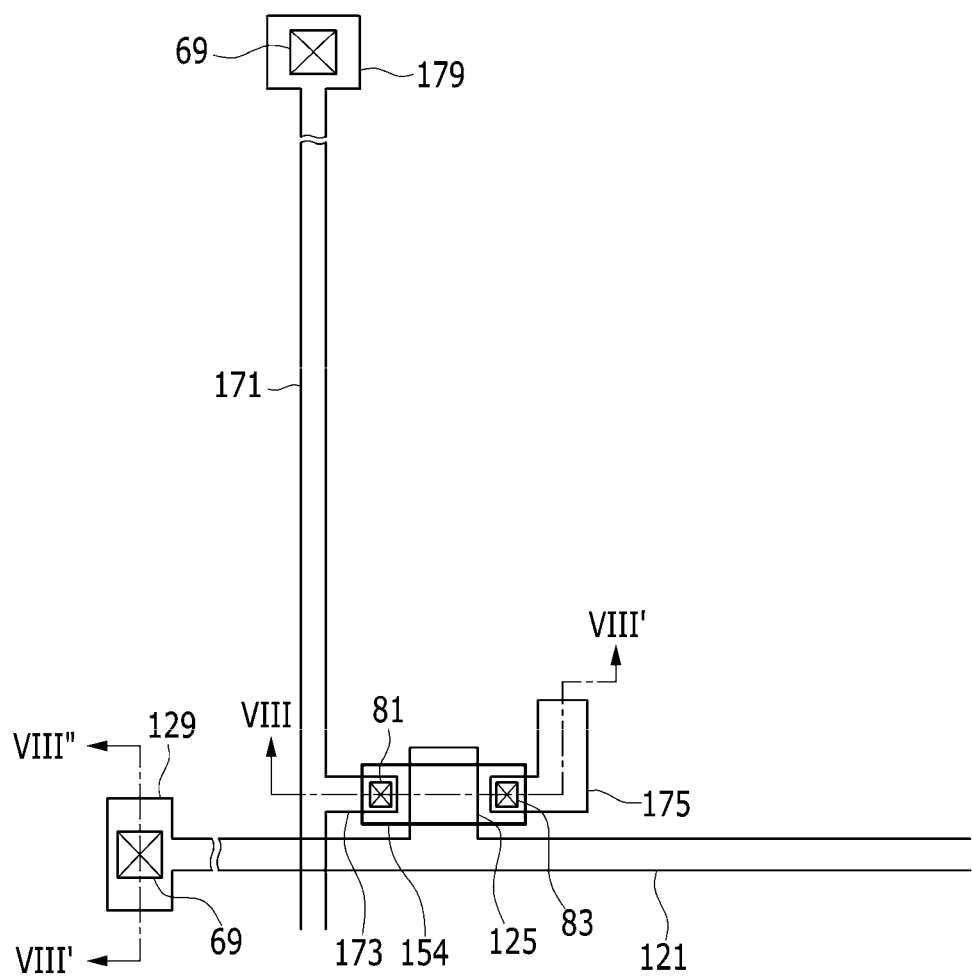
FIG. 7 is a layout view of a next step of FIG. 5.
Figure 8:
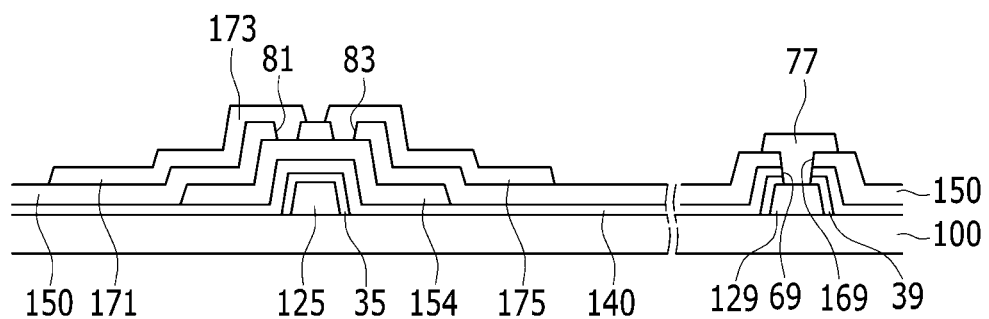
FIG. 8 is a cross-sectional view taken along lines VIII-VIII' and VIII'-VIII" of FIG. 7.
Figure 9:
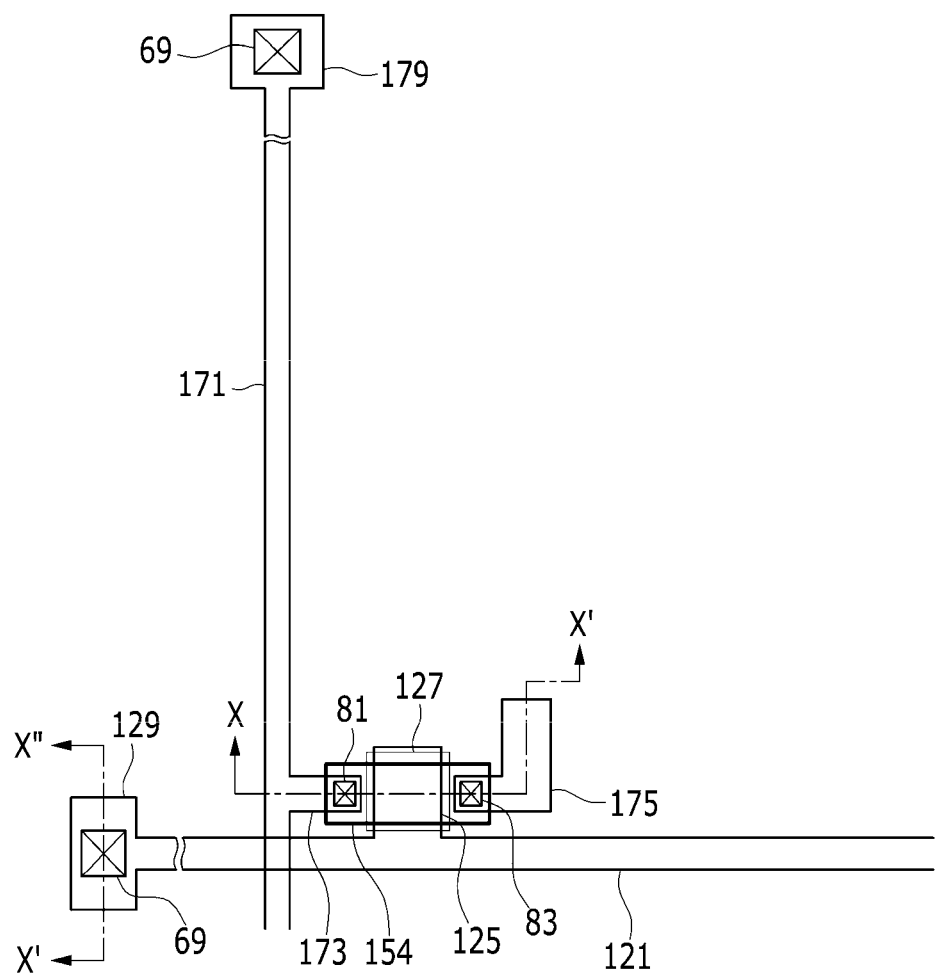
FIG. 9 is a layout view of a next step of FIG. 7.
Figure 10:
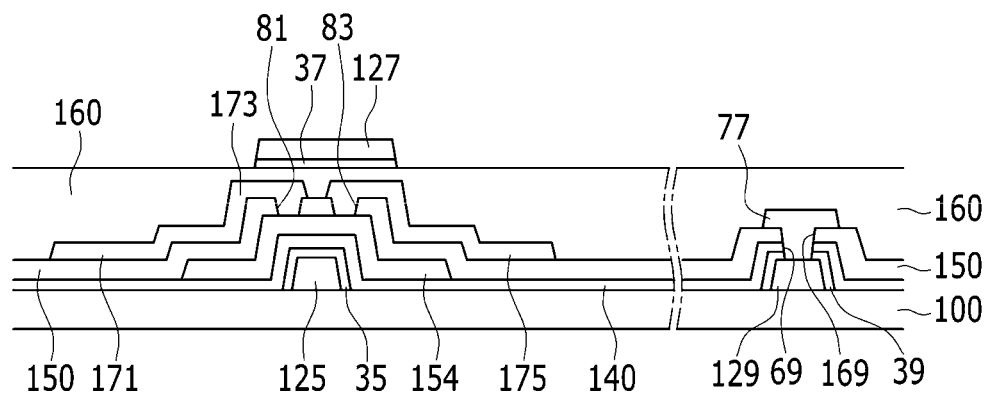
FIG. 10 is a cross-sectional view taken along lines X-X' and X'-X" of FIG. 9.

FIG. 3 is a layout view of a thin-film transistor array panel according to exemplary embodiments. FIG. 4 is a cross-sectional view taken along lines IV-IV' and IV'-IV" of FIG. 3. FIG. 5 is a layout view of a next step of FIG. 3. FIG. 6 is a cross-sectional view taken along lines VI-VI' and VI'-VI" of FIG. 5. FIG. 7 is a layout view of a next step of FIG. 5. FIG. 8 is a cross-sectional view taken along lines VIII-VIII' and VIII'-VIII" of FIG. 7. FIG. 9 is a layout view of a next step of FIG. 7. FIG. 10 is a cross-sectional view taken along lines X-X' and X'-X" of FIG. 9.

Referring to FIG. 3 and FIG. 4, a gate line 121 having a first gate electrode 125 and a gate pad 129 is formed on a substrate 100.

A self-assembled monolayer 35 and 39 is respectively formed on the gate line 121, by coating an electron acceptor material or an electron donor material, to form a preliminary monolayer. The preliminary monolayer may be a polymer material including the thiol group having large affinity with the metal. The preliminary monolayer may be formed by a spin coating, a dip coating, or a vaporization method. When using the spin coating, the thickness of the preliminary monolayer may be controlled by controlling a concentration of a coated solution.

Next, the preliminary monolayer not reacted with the gate line 121 is removed through cleansing, to form the first self-assembled monolayer 35 and 39, such that the first self-assembled monolayer 35 and 39 is formed only on a portion of the gate line 121 corresponding to the first gate electrode 125 and the gate pad 129.

Next, referring to FIG. 5 and FIG. 6, a gate insulating layer 140 is formed on the substrate 100, and a semiconductor 154 overlapping the first gate electrode 125 is formed on the gate insulating layer 140. The semiconductor 154 may be formed of an oxide semiconductor.

Next, referring to FIG. 7 and FIG. 8, an etching stop layer 150 is formed on the substrate 100, and the etching stop layer 150 is selectively etched to form contact holes 81 and 83 exposing the semiconductor 154, and a contact hole 69 exposing the gate pad 129. According to an exemplary embodiment of the present invention, the etching stop layer 150 may be formed only on the channel of the semiconductor 154 without the contact hole.

Next, referring to FIG. 9 and FIG. 10, a metal layer is formed on the etching stop layer 150. The metal layer is patterned to form a source electrode 173 and a drain electrode 175 connected to the semiconductor 154 through the contact holes 81 and 83, and an assistance gate pad 77 connected to the gate pad 129 through the contact hole 69. The etching stop layer 150 may cover the channel of the semiconductor 154 to protect the channel, thereby preventing the channel of the semiconductor 154 from being exposed and damaged.

Next, a first interlayer insulating layer 160 is formed on the substrate 100, and a preliminary monolayer including the electron donator material or the electron acceptor material is formed on the first interlayer insulating layer 160. The preliminary monolayer may be formed of polymer material including a silane group, which may react with the first interlayer insulating layer 160.

Next, a metal layer is formed on the preliminary monolayer and patterned to form the second gate electrode 127. The preliminary monolayer is removed by using the second gate electrode 127 as a mask, to complete a second self-assembled monolayer 37 positioned between the second gate electrode 127 and the first interlayer insulating layer 160.

Next, referring back to FIG. 1 and FIG. 2, a second interlayer insulating layer 180 is formed on the substrate 100. Subsequently, a metal layer is formed on the second interlayer insulating layer 180 and patterned to form a pixel electrode 191 and contact assistants 97 and 99.

Although certain exemplary embodiments and implementations have been described herein, other embodiments and modifications will be apparent from this description. Accordingly, the inventive concept is not limited to such exemplary embodiments, but rather to the broader scope of the presented claims and various obvious modifications and equivalent arrangements.

What is claimed is:

1. A thin-film transistor array panel, comprising:
    a substrate;
    a first gate electrode disposed on the substrate;
    a first self-assembled monolayer disposed on the first gate electrode;
    a gate insulating layer disposed on the first self-assembled monolayer;
    a semiconductor disposed on the gate insulating layer;
    a drain electrode overlapping the semiconductor, the drain electrode being separated from and facing a source electrode with respect to the semiconductor;
    a first interlayer insulating layer disposed on the source electrode and the drain electrode;
    a second self-assembled monolayer disposed on the first interlayer insulating layer;
    a second gate electrode disposed on the second self-assembled monolayer;
    a second interlayer insulating layer disposed on the second gate electrode; and
    a pixel electrode disposed on the second interlayer insulating layer and connected to the drain electrode.

2. The thin-film transistor array panel of claim 1, wherein:
    the first gate electrode is configured to receive a scan signal from a gate line disposed on the substrate; and
    the second gate electrode is configured to be floated.

3. The thin-film transistor array panel of claim 1, wherein:
    the first self-assembled monolayer comprises a first polymer material comprising a thiol group; and
    the second self-assembled monolayer comprises a second polymer material comprising a silane group.

4. The thin-film transistor array panel of claim 3, wherein:
    the first self-assembled monolayer comprises a fluoroaryl thiol derivative; and
    the second self-assembled monolayer comprises a fluoroaryl silane derivative or a fluoroalkyl silane derivative.

5. The thin-film transistor array panel of claim 4, wherein the semiconductor is an N-type semiconductor.

6. The thin-film transistor array panel of claim 3, wherein:
    the first self-assembled monolayer comprises an aminoaryl thiol derivative; and
    the second self-assembled monolayer comprises an aminoalkyl silane derivative or an aminoaryl silane derivative.

7. The thin-film transistor array panel of claim 6, wherein the semiconductor is a P-type semiconductor.

8. The thin-film transistor array panel of claim 1, wherein:
    the first self-assembled monolayer is disposed between the gate insulating layer and the first gate electrode; and
    the second self-assembled monolayer is disposed between the first interlayer insulating layer and the second gate electrode.

9. The thin-film transistor array panel of claim 1, wherein the second gate electrode overlaps the first gate electrode.

10. The thin-film transistor array panel of claim 1, further comprising:
an etching stop layer overlapping the semiconductor between the source electrode and the drain electrode.

11. A method of forming a thin-film transistor array panel, the method comprising:
forming a first gate electrode on a substrate;
forming a first self-assembled monolayer on the first gate electrode;
forming a gate insulating layer on the first self-assembled monolayer;
forming a semiconductor on the gate insulating layer;
forming a drain electrode overlapping the semiconductor, the drain electrode being separated from and facing a source electrode with respect to the semiconductor;
forming a first interlayer insulating layer on the source electrode and the drain electrode;
forming a second self-assembled monolayer on the first interlayer insulating layer;
forming a second gate electrode on the second self-assembled monolayer;
forming a second interlayer insulating layer on the second gate electrode; and
forming a pixel electrode on the second interlayer insulating layer and connected to the drain electrode.

12. The method of claim 11, wherein:
the first self-assembled monolayer comprises a first polymer material comprising a thiol group; and
the second self-assembled monolayer comprises a second polymer material comprising a silane group.

13. The method of claim 12, wherein:
the semiconductor is doped with N-type conductivity impurities;
the first self-assembled monolayer comprises a fluoroaryl thiol derivative; and
the second self-assembled monolayer comprises a fluoroaryl silane derivative or a fluoroalkyl silane derivative.

14. The method of claim 12, wherein:
the semiconductor is doped with P-type conductivity impurities;
the first self-assembled monolayer comprises an aminoaryl thiol derivative; and
the second self-assembled monolayer comprises an aminoalkyl silane derivative or an aminoaryl silane derivative.

15. The method of claim 11, wherein forming the first self-assembled monolayer comprises removing a portion of the first self-assembled monolayer by cleansing, such that the first self-assembled monolayer covers the first gate electrode.

16. The method of claim 15, wherein forming the second self-assembled monolayer comprises etching a portion of the second self-assembled monolayer, such that the second self-assembled monolayer overlaps the second gate electrode.

* * * * *